(12) United States Patent
Fotouhi et al.

(10) Patent No.: US 6,700,431 B1
(45) Date of Patent: Mar. 2, 2004

(54) I/O PAD OVERVOLTAGE PROTECTION CIRCUITRY

(75) Inventors: Bahram Fotouhi, Cupertino, CA (US); Bahman Farzan, Mountain View, CA (US); Saied Rafati, Saratoga, CA (US)

(73) Assignee: Exar Corporation, Fremont, CA (US)

( * ) Notice: Subject to any disclaimer, the term of this patent is extended or adjusted under 35 U.S.C. 154(b) by 47 days.

(21) Appl. No.: 10/241,115

(22) Filed: Sep. 10, 2002

(51) Int. Cl.[7] ............. H03K 17/62; H03K 17/693; H03K 17/735; H03K 17/76
(52) U.S. Cl. ............. 327/404; 327/391; 327/328; 327/537; 326/113; 361/56
(58) Field of Search ............. 327/379, 389, 327/391, 399, 403, 404, 427, 434, 436, 437, 534, 535, 537, 313, 318, 321, 327, 328; 326/81, 113; 361/56, 91.1, 91.5

(56) References Cited

U.S. PATENT DOCUMENTS

| 5,563,540 A | * | 10/1996 | Ashley et al. ............. 327/379 |
| 5,617,055 A | * | 4/1997 | Confalonieri et al. ........ 327/404 |
| 5,914,627 A | | 6/1999 | Fotouhi ..................... 327/404 |
| 5,926,056 A | | 7/1999 | Morris et al. ............... 327/333 |
| 6,037,828 A | | 3/2000 | Fotouhi ..................... 327/404 |
| 6,137,311 A | | 10/2000 | Hedberg ..................... 326/81 |

* cited by examiner

Primary Examiner—Long Nguyen
(74) Attorney, Agent, or Firm—Townsend and Townsend and Crew, LLP

(57) ABSTRACT

A protection circuit for a transmission gate having a PMOS transmission gate transistor and an NMOS transmission gate transistor coupled between a core circuit and an I/O pad. Biasing transistors are coupled to gates of the NMOS and PMOS transmission gate transistors to turn them on during normal operation. A protection circuit will turn off the NMOS and PMOS transmission gate transistors when the voltage at the pad exceeds the supply voltage by more than a threshold amount. This protection circuit includes a first protection transistor coupled between the gates of the biasing transistors and the pad to turn the biasing transistors off when the voltage on the pad exceeds the supply voltage by more than the threshold amount.

11 Claims, 2 Drawing Sheets

US 6,700,431 B1

I/O PAD OVERVOLTAGE PROTECTION CIRCUITRY

CROSS-REFERENCES TO RELATED APPLICATIONS

This application is related to co-pending application "CMOS Transmission Gate with High Impedance at Power-Off", application Ser. No. 10/119,101, filed Apr. 8, 2002, and "Input Termination with High Impedance at Power Off", application Ser. No. 10/093,227, filed Mar. 5, 2002.

BACKGROUND OF THE INVENTION

The present invention relates generally to I/O circuits, and in particular to transmission gates with over-voltage protection.

The transmission gate is an integrated circuit which connects between an internal, core circuit and an I/O pad. The transmission gate circuit acts as a low-impedance connection to the pad under normal conditions where the supply voltage $V_{dd}$ is greater than the voltage at the pad, which is also greater than zero or ground. However, when the I/O pad is subject to voltage spikes, or acts as an input, it is possible that its voltage may exceed that of the supply voltage. For example, a chip designed with a 3.3 volt power supply may be connected to another chip which uses 5-volt levels.

FIG. 1 illustrates a prior art transmission gate circuit. NMOS transmission gate transistor M10 and PMOS transmission gate transistor M9 connect core circuitry 10 to an I/O pad 12. The P-well 14 of transistor M10 is connected to ground, while the N-well 16 of transistor M9 is connected to the power supply, $V_{dd}$.

During normal conditions, when $V_{dd}$ is greater than the voltage at the pad, $V_{pad}$, which is greater than zero, the transmission gate is on. If the voltage at the pad should exceed the supply voltage by more than a threshold amount, the P-channel transistor M10 is still on, effectively connecting pad terminal 12 to the internal core circuit. Thus, this circuit does not isolate the internal circuitry from the I/O pad when the pad voltage exceeds the supply voltage. If the voltage on the pad is greater than the supply voltage, the intrinsic PN diode between the source and the bulk (P-well 16) of transistor M9 will turn on, shorting pad 12 to $V_{dd}$. Alternately, the channel of PMOS transistor M9 can simply turn on due to negative gate-to-source potential with the gate at zero and the source at a positive potential.

BRIEF SUMMARY OF THE INVENTION

The present invention provides a protection circuit for a transmission gate having a PMOS transmission gate transistor and an NMOS transmission gate transistor coupled between a core circuit and an I/O pad. A biasing transistor is coupled to a gate of the NMOS transmission gate transistor to turn it on during normal operation. A protection circuit will turn off the NMOS transmission gate transistor when the voltage at the pad exceeds the supply voltage by more than a threshold amount. This protection circuit includes a first protection transistor coupled between the gate of the biasing transistor and the pad to turn the biasing transistor off when the voltage on the pad exceeds the supply voltage by more than the threshold amount.

In one embodiment, one or more NMOS protection transistors are coupled between the gate of the PMOS transmission gate transistor and ground, with the gate of the PMOS transmission gate transistor being connected to the first protection transistor. In addition, an N-well biasing circuit is provided with a PMOS transistor coupled between the N-well and the pad, with the gate coupled to the supply voltage. Additionally, a second PMOS transistor is connected between the supply voltage $V_{dd}$ and the N-well, with its gate connected to the first protection transistor.

In one embodiment, a second NMOS transmission gate transistor is added to limit the voltage drop across the first NMOS transmission gate transistor.

For a further understanding of the nature and advantages of the invention, reference should be made to the following description taken in conjunction with the accompanying drawings.

DETAILED DESCRIPTION OF THE INVENTION

Figure 1:
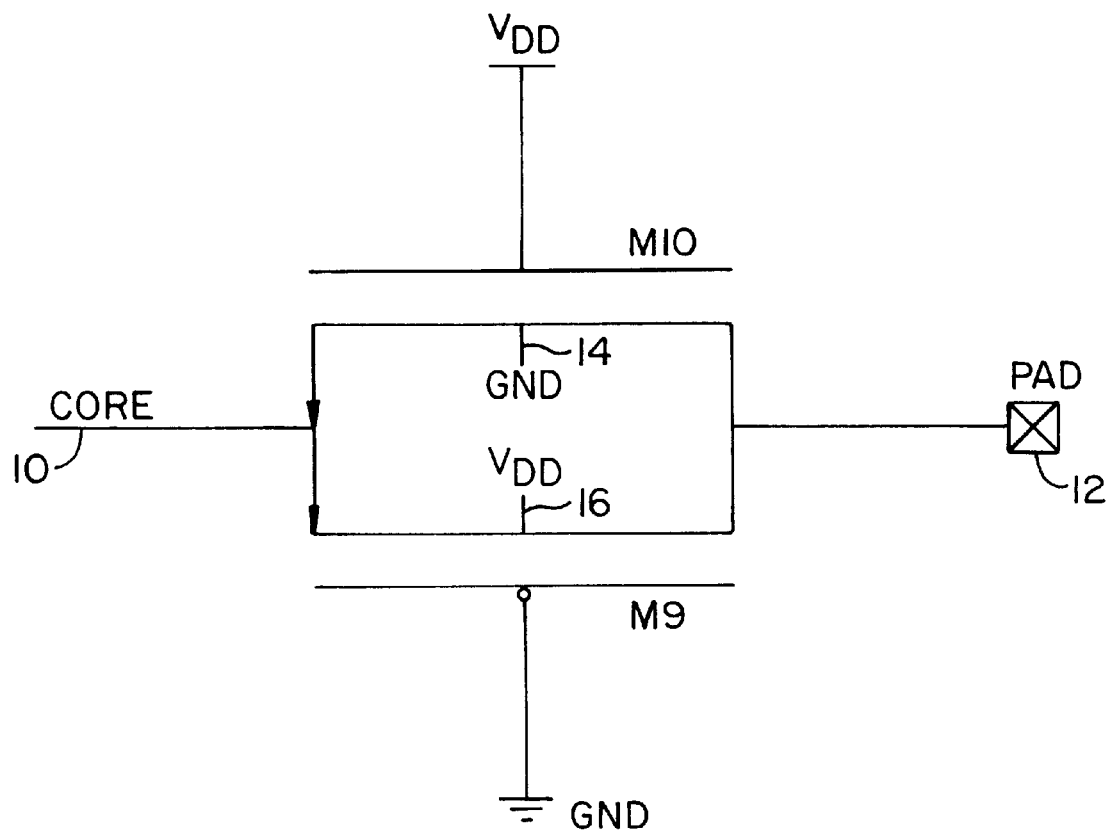
FIG. 1 is a diagram of a prior art transmission gate circuit.
Figure 2:
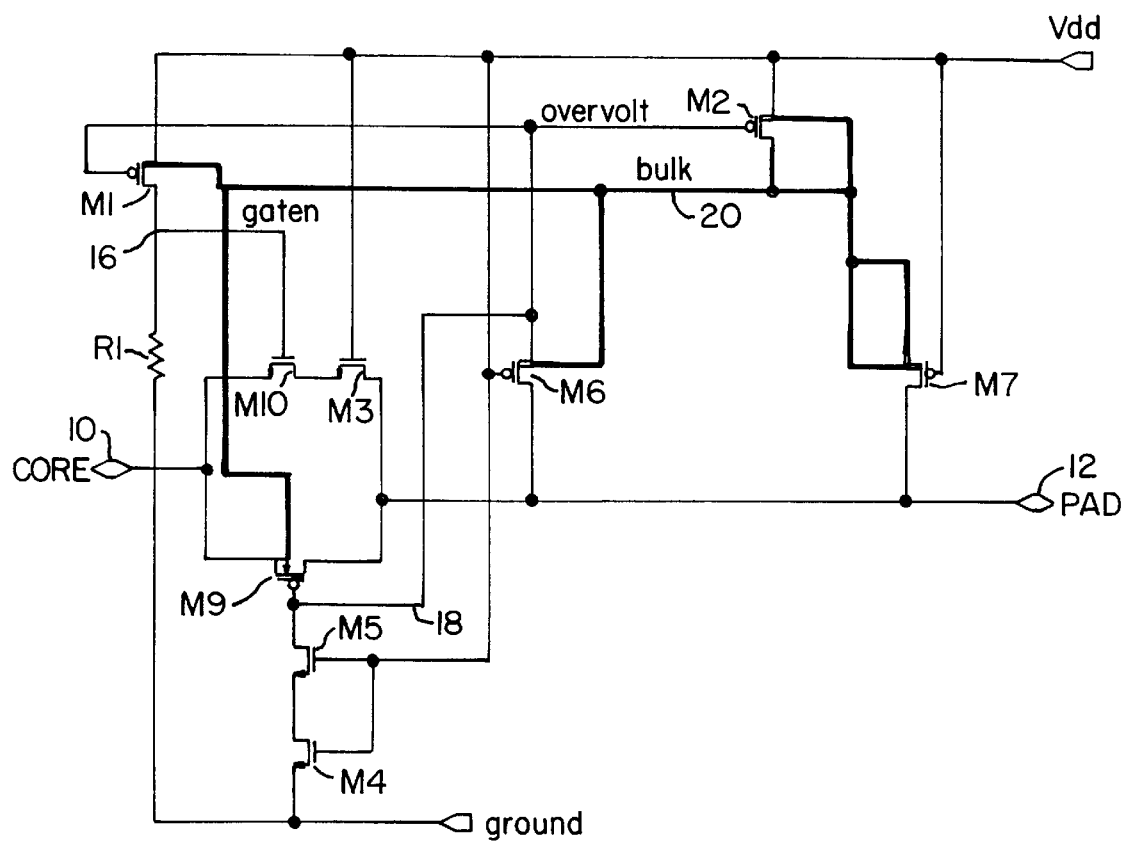
FIG. 2 is a circuit diagram of one embodiment of the invention.

FIG. 2 is a circuit diagram of an embodiment of the invention. As can be seen, transmission gates M9 and M10 connect between core circuitry 10 and I/O pad 12 as in FIG. 1. A second NMOS transmission gate transistor M3 is added in one embodiment of the invention, to limit the voltage drop across transistor M10 during an over-voltage condition.

The gate of NMOS transmission gate transistor M10 is controlled by a signal GATEN, which is connected between a transistor M1 and a resistor R1. R1 connects to ground, while M1 connects to the supply voltage, $V_{dd}$. The gate of PMOS transmission gate transistor M9 is controlled by a signal OVERVOLT, which is connected to a protection transistor M6. The protection transistor M6 is connected between the output pad 12 and the OVERVOLT line 19, with its gate connected to the supply voltage, $V_{dd}$. Transistor M6 is normally off, but turns on when the pad voltage 12 exceeds $V_{dd}$. This will cause it to turn on, connecting the OVERVOLT line 18 to the pad 12, turning off transistor M1, thus allowing resistor R1 to pull the gate of transistor M10 to ground. This ensures that transistor M10 is shut off, causing a high impedance between pad 12 and core circuitry 10. In order to limit this voltage drop so that it is not all across transistor M10, a second transistor M3 may be added, with its gate connected to the supply voltage $V_{dd}$. This is particularly useful for small geometry transistors.

Transistors M7 and M2 bias the N-well of the PMOS transistors. This N-well is indicated by BULK line 20. Under an overvoltage condition, transistor M7 will turn on, pulling the N-well BULK line 20 to the pad voltage. M2 maintains the N-well at $V_{dd}$ during normal operation.

Transistors M4 and M5 connect the gate of PMOS transmission gate transistor M9 to ground. When the pad voltage exceeds the supply voltage, node 18 (OVERVOLT) is connected to the pad voltage, ensuring that the PMOS transmission gate transistor M9 is also turned off, thus isolating the core.

The cascode connection of N-channel transistors M3 and M10 reduces their gate-to-source and drain-to-source voltages, protecting them from the excess voltage at the pad and thus preventing gate rupture. Devices M4 and M5 are long-channel devices, that together with M6 form a ratioed logic when $V_{PAD} > V_{dd} > 0$, and allow M6 to pull up node OVERVOLT 18 to the pad voltage. Under normal conditions of Vpad<Vdd, OVERVOLT 18 is pulled to ground, turning M9 on. M1 is also turned on, pulling the gate of M10 to Vdd and turning it on. This connects the core to the pad under normal conditions.

As will be understood by those with skill in the art, the present invention may be embodied in other specific forms without departing from the essential characteristics thereof. For example, transistor M3 is optional, and could be left out if transistor M10 is of a sufficient size to handle the overvoltage. Alternately, the protection circuitry of the invention could be implemented at the core circuit level, rather than at the transmission gate. However, by implementing at the transmission gate, only a single circuit is needed for each pad. Accordingly, the foregoing description is intended to be illustrative, but not limiting, of the scope of the invention which is set forth in the following claims.

What is claimed is:

1. A transmission gate circuit comprising:
   a PMOS transmission gate transistor and an NMOS transmission gate transistor coupled between a core circuit and an I/O pad;
   a biasing transistor coupled to a gate of said NMOS transmission gate transistor to turn said NMOS transmission gate transistor on during normal operation; and
   a protection circuit configured to turn off said NMOS transmission gate transistor when a voltage on said I/O pad exceeds a supply voltage by more than a threshold amount, said protection circuit including
      a first protection transistor coupled between a gate of said biasing transistor and said I/O pad to turn said biasing transistor off when the voltage on said I/O pad exceeds the supply voltage by more than the threshold amount.

2. The circuit of claim 1 wherein said protection circuit further comprises:
   at least one NMOS protection transistor coupled between a gate of said PMOS transmission gate transistor and ground, wherein a gate of said PMOS transmission gate transistor is coupled to said first protection transistor.

3. The circuit of claim 1 further comprising:
   a second NMOS transmission gate transistor coupled between said core circuit and said I/O pad, and having a gate coupled to said supply voltage.

4. The circuit of claim 1 further comprising:
   an n-well biasing circuit, including at least one n-well biasing PMOS transistor coupled between an n-well and said I/O pad, and having a gate coupled to said supply voltage.

5. A transmission gate circuit comprising:
   a PMOS transmission gate transistor and an NMOS transmission gate transistor coupled between a core circuit and an I/O pad;
   a biasing transistor coupled to a gate of said NMOS transmission gate transistor to turn said NMOS transmission gate transistor on during normal operation; and
   a protection circuit configured to turn off said NMOS transmission gate transistor when a voltage on said I/O pad exceeds a supply voltage by more than a threshold amount, said protection circuit including
      a first protection transistor coupled between a gate of said biasing transistor and said I/O pad to turn said biasing transistor off when the voltage on said I/O pad exceeds the supply voltage by more than the threshold amount;
      at least one NMOS protection transistor coupled between a gate of said PMOS transmission gate transistor and ground, wherein the gate of said PMOS transmission gate transistor is coupled to said first protection transistor; and
   an n-well biasing circuit, including at least one n-well biasing PMOS transistor coupled between an n-well and said pad, and having a gate coupled to said supply voltage.

6. The circuit of claim 5 wherein said n-well biasing circuit further comprises:
   a second n-well biasing PMOS transistor coupled between said supply voltage and said n-well, and having a gate coupled to said first protection transistor, such that said first protection transistor turns said second n-well biasing PMOS transistor off when the voltage on said I/O pad exceeds said supply voltage by more than said threshold amount.

7. The circuit of claim 5 further comprising:
   a resistor coupled between said biasing transistor and ground.

8. The circuit of claim 5 further comprising:
   a second NMOS transmission gate transistor coupled between said core circuit and said I/O pad, and having a gate coupled to said supply voltage.

9. A method for protecting against overvoltage on an I/O pad in a transmission gate circuit having a PMOS transmission gate transistor and an NMOS transmission gate transistor coupled between a core circuit and the I/O pad, comprising:
   turning said NMOS transmission gate transistor on during normal operation; and
   turning off said NMOS transmission gate transistor when a voltage on said I/O pad exceeds a supply voltage by more than a threshold amount, using a first protection transistor coupled between a gate of a biasing transistor for said NMOS transmission gate transistor and said I/O pad to turn said biasing transistor off when the voltage on said I/O pad exceeds the supply voltage by more than the threshold amount.

10. The method of claim 9 further comprising:
    biasing an n-well of said PMOS transmission gate transistor using at least one n-well biasing PMOS transistor coupled between said n-well and said I/O pad, and having a gate coupled to said supply voltage.

11. The method of claim 9 further comprising:
    limiting a voltage drop across said NMOS transmission gate transistor with a second NMOS transmission gate transistor coupled between said core circuit and said I/O pad.

* * * * *